United States Patent [19]

Kawaguchi

[11] Patent Number: 5,220,572
[45] Date of Patent: Jun. 15, 1993

[54] LIGHT PULSE GENERATOR

[75] Inventor: Hitoshi Kawaguchi, Yonezawa, Japan

[73] Assignee: Pioneer Electronic Corporation, Tokyo, Japan

[21] Appl. No.: 800,108

[22] Filed: Nov. 29, 1991

[30] Foreign Application Priority Data

May 27, 1991 [JP] Japan .................. 3-121448

[51] Int. Cl.$^5$ ............................... H01S 3/13
[52] U.S. Cl. ........................ 372/30; 372/18; 372/23; 372/25; 372/49; 372/92; 372/97
[58] Field of Search .............. 372/92, 97, 30, 23, 372/25, 18, 29, 49, 108, 50, 20

[56] References Cited

U.S. PATENT DOCUMENTS 4,868,833  9/1989  Stultz et al. ..................... 372/23

FOREIGN PATENT DOCUMENTS 0117734  9/1984  European Pat. Off. .
0103982  4/1990  Japan ............................. 372/50

OTHER PUBLICATIONS

Lau, K. Y., "Short Pulse and High Frequency Signal Generation in Semiconductor Lasers," Journal of Lightwave *Technology*, vol. 7, No. 2, Feb. 1989, pp. 400-419.
Bowers et al., "Actively Mode Locked Semiconductor Lasers," *IEEE Journal of Quantum Electronics*, vol. 25, No. 6, Jun. 1989, pp. 1426-1439.
Eisenstein et al., "InGaASP 1.3 μm Optical Amplifier Modulator Integrated With a Fibre Resonator Mode Locked Laser," *Electronics Letters*, vol. 20, No. 15, Jul. 1984, pp. 624-625.
Ozeki et al., "Polarization Switching and Bistablity in an External Cavity Laser With a Polarization Sensitive Saturable Absorber," *Applied Physics Letters*, vol. 58, No. 20, May 1991, pp. 2214-2216.
Kawaguchi et al., "Picosecond Optical Pulse Generation From Mutually Coupled Laserdiodes by Synchronous Pump Mode Locking," *Japanese Journal of Applied Physics, Part 2, Letters*, vol. 30, No. 8A, Aug. 1991, pp. L1402-L1405.

*Primary Examiner*—Georgia Y. Epps
*Attorney, Agent, or Firm*—Sughrue, Mion, Zinn, Macpeak & Seas

[57] ABSTRACT

A light pulse generator is provided comprising, a first and a second semiconductor laser diodes, each having a highly reflective surface and a non-reflective surface arranged opposite to each other, an optical system arranged between the highly reflective surfaces of the first and the second semiconductor laser diodes with the two non-reflective surfaces being confronted by each other, and a current supply for feeding the first and the second semiconductor laser diodes with discrete high-frequency currents respectively. The high-frequency currents repeat at intervals of a period equal to n times (n being an integer) the duration of light traveling one cycle within the optical resonator and have a phase difference of π/n from each other. Accordingly, the light pulse generator can produce a series of short-width light pulses while minimizing the generation of unwanted sub pulses.

6 Claims, 3 Drawing Sheets (a)

(b)

LIGHT PULSE GENERATOR

BACKGROUND OF THE INVENTION

1. Field of the Invention

The present invention relates to a light pulse generator provided with small-sized semiconductor laser diodes for generating a series of light pulses with high peak power and short pulse width.

2. Description of the Prior Art

A typical light pulse generator is shown in FIG. 1.

As shown, a semiconductor laser diode 1 has at one end a highly reflective surface 1a and at the other end a non-reflective surface 4. The non-reflective surface 4 is finished with a non-reflection coating for minimizing the reflectance on the outer surface of the laser diode.

A lens 2 is arranged in such a position that the semiconductor laser diode 1 is optically coupled to a reflecting mirror 3 for forming an optical resonator. More specifically, the highly reflective surface 1a, the lens 2, and the reflecting mirror 3 are arranged to serve in combination as an optical resonator for permitting the semiconductor laser diode 1 to produce mode locked oscillation. The semiconductor laser diode 1 is arranged to be supplied with a mode synchronizing high-frequency current from a capacitor 6 and a bias direct current from an inductance coil 7.

The action of the prior art light pulse generator will now be described. Upon receiving a DC bias current from the coil 7 and a high-frequency current of frequency f ($f = c/2L$ where L is the resonator length and c is the velocity of light) from the capacitor 6, the semiconductor laser diode 1 generates a series of light pulses P at regular intervals of $1/f$, as shown in FIG. 2(b). It is known that this type of a light pulse generator produces a series of short pulses at about the threshold of oscillation of its semiconductor laser diode, as shown in FIG. 2(a). However, when the feeding current is increased for enhancement of the output, unwanted sub pulses are also developed at a frequency corresponding to the length 1 of the semiconductor laser diode (See FIG. 1) or at intervals of $2l/c$ due to residual reflection (commonly 0.1 to 1%) on the non-reflective coating 4 of the semiconductor laser diode, thus increasing the pulse width as shown in FIG. 2(b).

SUMMARY OF THE INVENTION

The present invention provides for the elimination of the foregoing drawback of the prior art light pulse generator, and its object is to provide an improved light pulse generator capable of producing a series of short-width light pulses with high peak power.

The light pulse generator according to the present invention comprises: a first and second semiconductor laser diodes, each having a highly reflective surface and a non-reflective surface arranged opposite to each other; an optical system arranged between the highly reflective surfaces of the first and second semiconductor laser diodes with the two non-reflective surfaces being confronted by each other; and a current supply for feeding the first and second semiconductor laser diodes with discrete high-frequency currents respectively. The currents repeat at intervals of a period equal to n times (n is an integer) the duration required for light to travel one cycle within the optical resonator, and have a phase difference of $\pi/n$ from each other.

In operation, the two semiconductor laser diodes complement each other, thus attenuating unwanted sub pulses.

DETAILED DESCRIPTION OF A PREFERRED EMBODIMENT

One preferred embodiment of the present invention will be described referring to the accompanying drawings.

Figure 1:
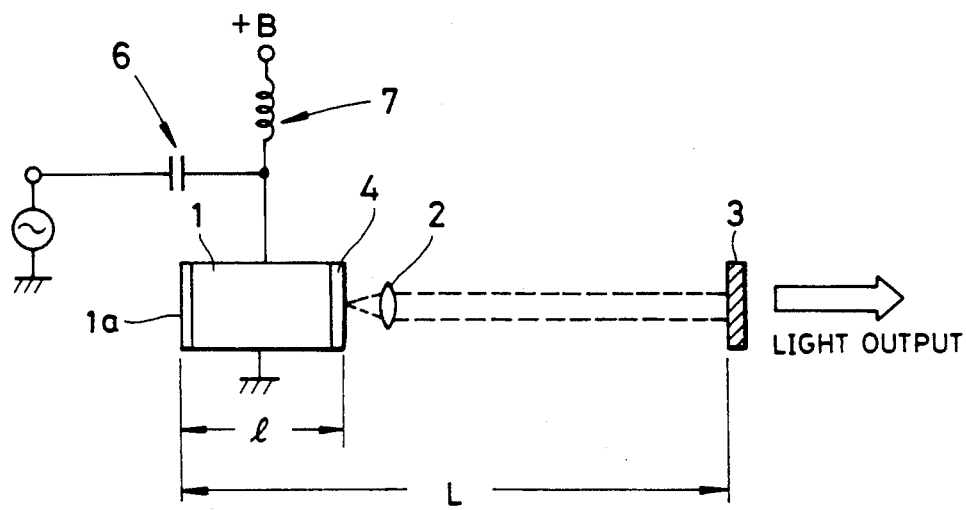
FIG. 1 is a schematic view of a prior art light pulse generator.
Figure 2:
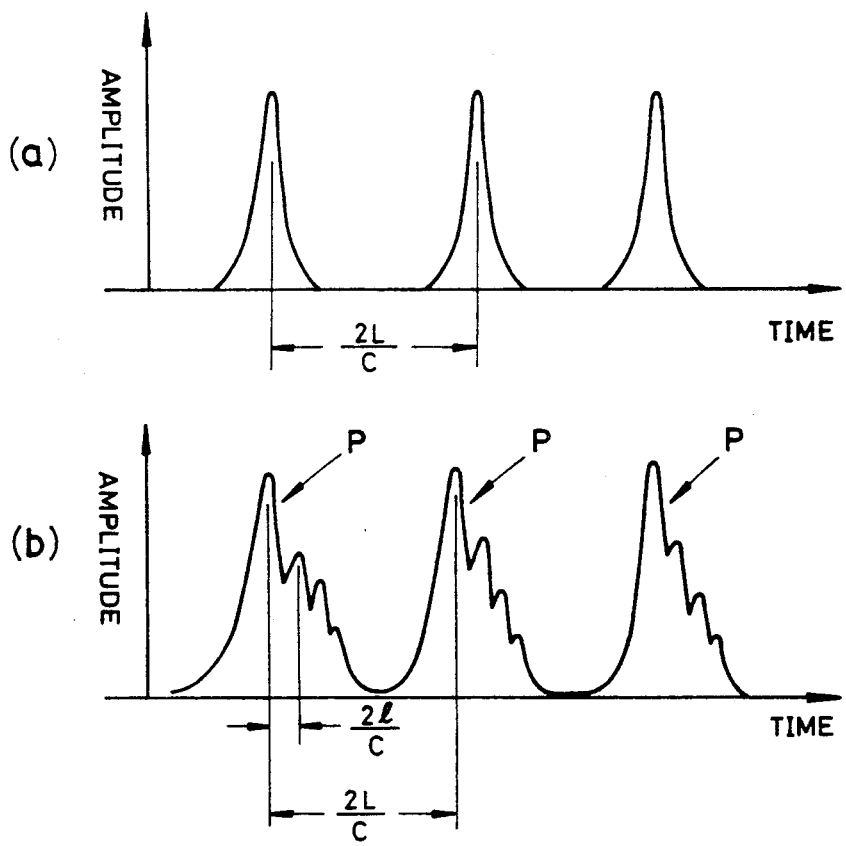
FIGS. 2(a) and 2(b) are graphic diagrams showing the waveform of two light pulse outputs produced by the prior art light pulse generator in low- and high-magnitude actions respectively.
Figure 3:
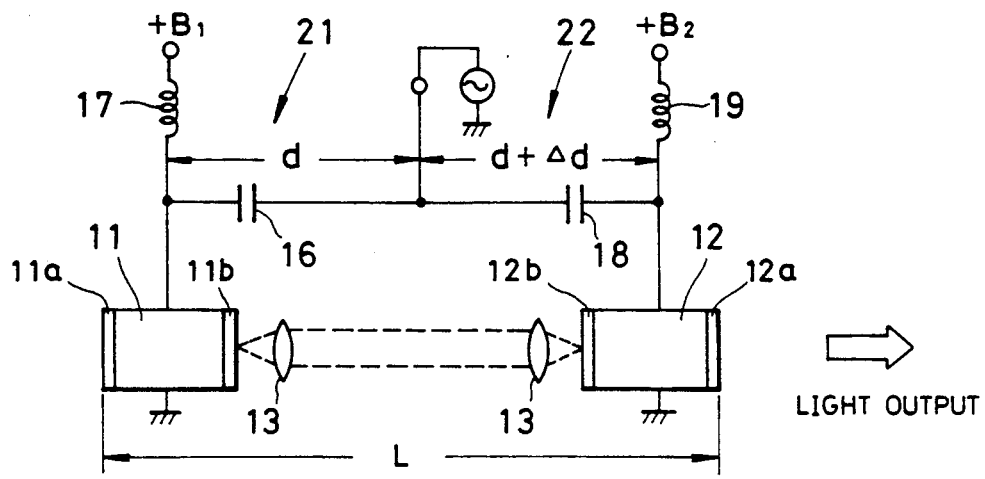
FIG. 3 is a schematic view showing one embodiment of the present invention.

FIG. 3 illustrates a light pulse generator according to the present invention, which comprises a first semiconductor laser diode 11 having at one end a highly reflective surface 11a and at the other end a non-reflective surface 11b, a second semiconductor laser diode 12 having at one end a highly reflective surface 12a and at the other end a non-reflective surface 12b, and a couple of lenses 13, 13 arranged to optically couple the two, first and second, semiconductor laser diodes 11 and 12 to each other for forming an optical resonator. More specifically, the first 11 and the second semiconductor laser diode 12 are adapted to receive from each other beams of output light which are emitted from the non-reflective surfaces 12b and 11b respectively and transmitted through the two lenses 13, 13, thus being optically coupled to each other by an optical system.

The light beams are amplified while traveling between the two highly reflective surfaces 11a and 12a of their respective first and second semiconductor laser diodes 11 and 12, i.e., by an optical resonator which has an optical length of L extending between the two highly reflective surfaces 11a and 12a. In other words, the optical resonator is composed of the two lenses 13, 13 and the two highly reflective surfaces 11a and 12a for permitting the first 11 and the second semiconductor laser diode 12 to produce mode locked oscillation.

Also, the light pulse generator has a current supply for feeding a mode synchronizing high-frequency current through a capacitor 16 and a bias DC current through an inductance coil 17 to the first semiconductor laser diode 11. Similarly, the second semiconductor laser diode 12 is fed by the current supply with a mode synchronous high-frequency current through a capacitor 18 and a bias DC current through an inductance coil 19. The high-frequency current supplied from the current supply has the same frequency as that of the prior art which is expressed as $f = c/2L$ (where c is the velocity of light and L is the length of the resonator). In particular, the high-frequency current is supplied from a high-frequency current source via a first 21 and a second high-frequency current cable 22 to two bias current lines coupled to their respective first and second semiconductor laser diodes 11, 12.

As shown in FIG. 3, the first 21 and the second high-frequency current cable 22 of the current supply which are connected to the first and second semiconductor laser diodes 11, 12 respectively, are adapted to have a length d and a length d+Δd respectively so that two high-frequency currents having a frequency f and supplied to the first and second semiconductor laser diodes 11, 12 together with DC bias currents are in opposite phase to each other. More particularly, the second high-frequency current cable 22 acts as a delay line.

As set forth above, the two semiconductor laser diodes of the light pulse generator of the present invention are arranged with their respective non-reflective surfaces distanced from each other for optical coupling and allow their respective highly reflective surfaces to act as optical resonating surface, thus forming an optical resonator. In operation, high-frequency currents recurring at regular intervals of a period equal to the duration of light traveling one cycle within the resonator are fed to the two semiconductor laser diodes with a time lag of half the period between them.

The operation of the light pulse generator of the present invention will now be described.

Figure 4:
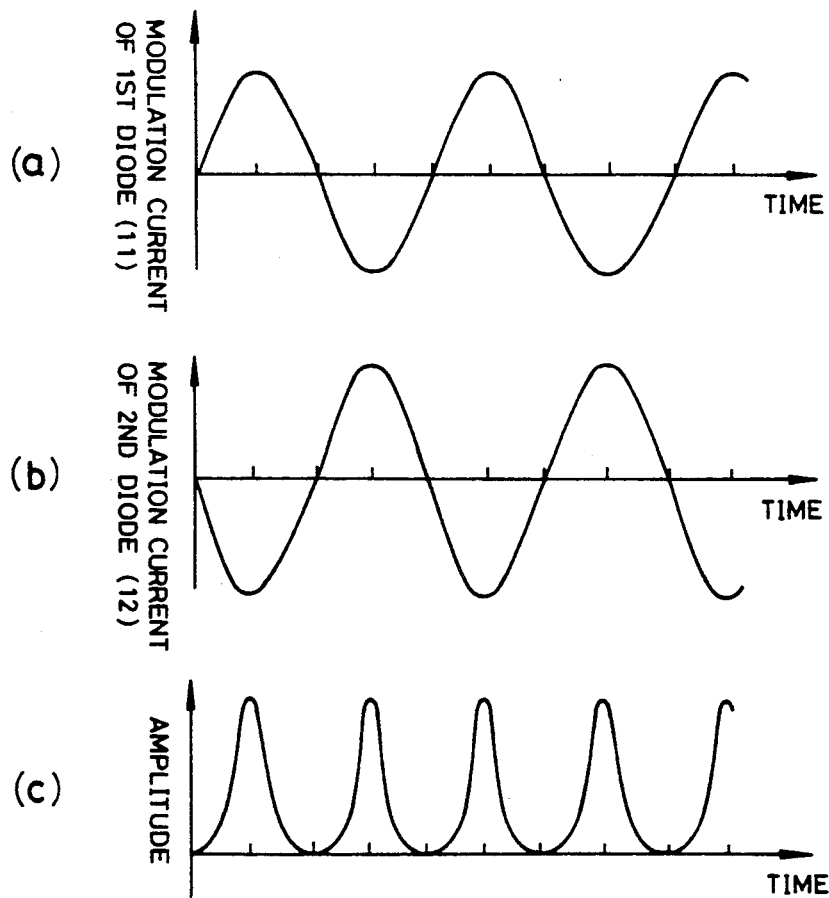
FIGS. 4(a)–4(c) are graphic diagrams explaining the generation of light pulses by the embodiment of the present invention.

When given rates of DC bias and high-frequency currents are supplied to the two semiconductor laser diodes 11, 12 light pulses are generated and cycled between the two highly reflective surfaces 11a and 12a of the optical resonator, as shown in FIG. 3. As the two high-frequency currents supplied to their respective semiconductor laser diodes 11 and 1 are in opposite phase to each other as best shown in FIGS. 4(a) and 4(b), the resultant light pulses are modulated in the positive direction (the upward direction in FIGS. 4(a) and 4(b), i.e., or gain amplified, when passing the two semiconductor laser diodes 11 and 12. As the highly reflective surface 12a has a partially reflective coating, the light pulses are shaped as shown in FIG. 4(c).

It is understood that when the bias current to the second semiconductor laser diode 12 is smaller than that to the first semiconductor laser diode 11, the generation of sub pulses is prevented by the gate effect of the second semiconductor laser diode 12 regardless of an increase in the bias current to the first semiconductor laser diode 11. Thus, a series of short-width light pulses with high peak power is produced.

Figure 5:
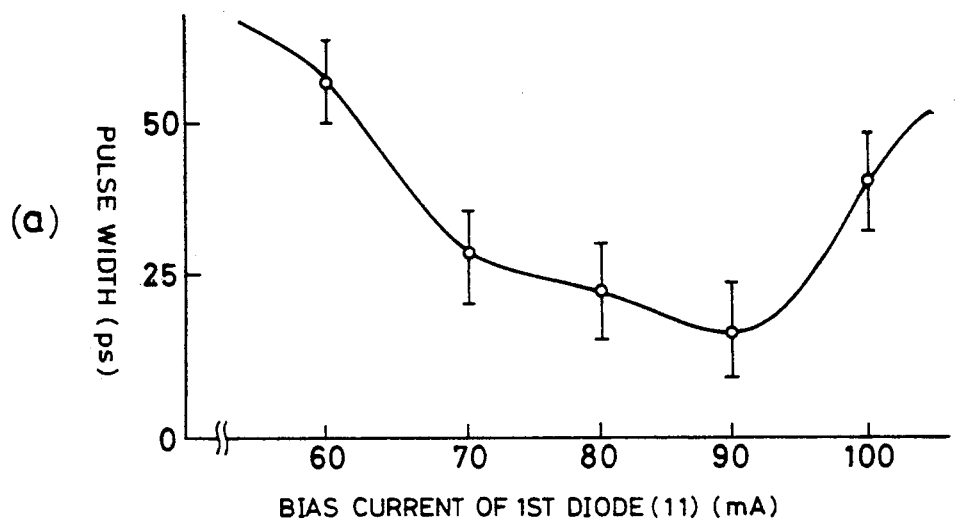
FIGS. 5(a) and 5(b) are graphic diagrams showing the pulse width and average output produced by the embodiment of the present invention.
Figure 5:
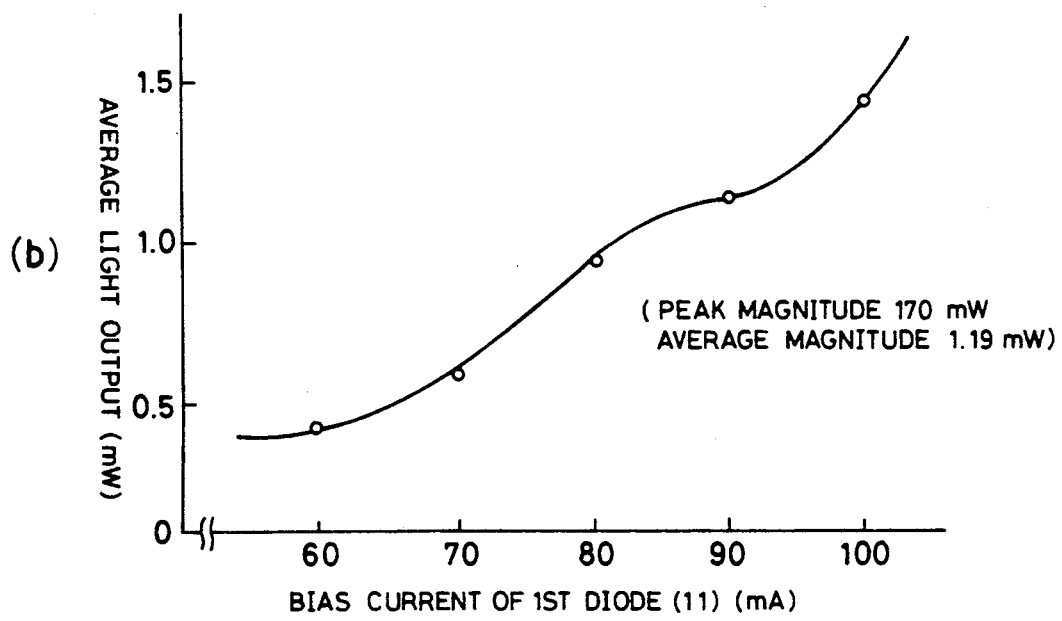

FIGS. 5(a) and 5(b) show the relation of a bias current of the first semiconductor laser diode 11 to resultant measurements of the pulse width and the average optical output. As is apparent from these figures, the shortest light pulse, which is about 7 ps in pulse width and has a frequency of 1 GHz at 1.19 mW average output and 170 mW peak output, is generated when the bias currents to the first 11 and the second semiconductor laser diode 12 are 90 mA and 25 mA respectively an where the high-frequency currents to the first 11 and the second semiconductor laser diode 12 are each 110 mAp-p.

Although the modulation frequency is f, corresponding to the length of a period (f=c/2L) in the embodiment, it may be an integer multiple of f, or f'=nc/2L (where n is an integer), while the phase difference between the two feeding currents to the first 11 and the second semiconductor laser diode 12 is $\pi/n$. In this case, the frequency of a generated light pulse waveform is equal to f'.

Accordingly, the light pulse generator of the present invention has the non-reflective surfaces of respective first and second semiconductor laser diodes arranged optically opposite to each other so that when phase-opposite currents are fed to the first and second semiconductor laser diodes respectively, a series of light pulses of short width and high magnitude can be produced while the generation of unwanted sub pulses is minimized.

What is claimed is:

1. A light pulse generator comprising:
   a first and a second semiconductor laser diode, each diode having a highly reflective surface and a non-reflective surface arranged opposite to each other;
   an optical system arranged between the highly reflective surfaces of the first and the second semiconductor laser diodes with the two non-reflective surfaces being confronted by each other, to form an optical resonator; and
   a current supply for feeding the first and second semiconductor laser diodes with respective discrete high-frequency currents and with respective bias currents, whereby the high-frequency currents repeat at intervals of a period equal to an integral multiple n of the duration for light to travel one cycle with the optical resonator, the high-frequency currents have a phase difference of $\pi/n$ from each other, and the bias current to the second semiconductor laser is smaller in amplitude than the bias current to the first semiconductor laser.

2. A light pulse generator according to claim 1, wherein said optical system comprises two lenses.

3. A light pulse generator according to claim 1, wherein said current supply comprises:
   a first capacitor for supplying the high-frequency current and a first inductance coil for supplying the bias current to the first semiconductor laser diode; and
   a second capacitor for supplying the high-frequency current and a second inductance coil for supplying the bias current to the second semiconductor laser diode.

4. A light pulse generator according to claim 3, wherein said current supply further comprises a first current cable and a second current cable, the cables being electrically connected with, respectively, the first semiconductor laser diode and the second semiconductor laser diode; and
   wherein the second current cable is longer than the first current cable by a predetermined length, such that the second current cable acts as a delay line.

5. A light pulse generator according to claim 1, wherein the highly reflective surface of the second semiconductor laser diode has a partially reflective coating, for producing a light output.

6. A light pulse generator according to claim 1, wherein the highly reflective surface of the first semiconductor laser diode has a partially reflective coating, for producing a light output.

* * * * *